United States Patent [19]

Rege et al.

[11] 4,215,423

[45] Jul. 29, 1980

[54] FAST ACCESS CHARGE COUPLED DEVICE MEMORY ORGANIZATIONS FOR A SEMICONDUCTOR CHIP

[75] Inventors: Satish L. Rege, Piscataway, N.J.; Beng-Yu Woo, San Diego, Calif.

[73] Assignee: Burroughs Corporation, Detroit, Mich.

[21] Appl. No.: 947,556

[22] Filed: Oct. 2, 1978

Related U.S. Application Data

[62] Division of Ser. No. 881,434, Feb. 27, 1978, Pat. No. 4,156,287, which is a division of Ser. No. 734,351, Oct. 20, 1976, Pat. No. 4,112,504.

[51] Int. Cl.² ............................................. G11C 21/00
[52] U.S. Cl. ....................................... 365/77; 365/183
[58] Field of Search ...................... 365/73, 77, 78, 183

[56] References Cited

U.S. PATENT DOCUMENTS

| 3,889,245 | 6/1975 | Gosney | 365/183 |
| 4,024,512 | 5/1977 | Amelio et al. | 365/183 |

OTHER PUBLICATIONS

Varshney et al., A Byte Organized NMOS/CCD Memory with Dynamic Refresh Logic, 2/76, IEEE Trans. on Electron Devices, vol. ED-23, No. 2, pp. 86–92.

Rosenbaum et al., 8192-Bit Block Addressable CCD Memory, IEEE Jour. of Solid-State Cir., vol. SC-10, No. 5, 10/75.

*Primary Examiner*—Stuart N. Hecker
*Attorney, Agent, or Firm*—Charles J. Fassbender; Joseph R. Dwyer; Kevin R. Peterson

[57] ABSTRACT

This disclosure relates to fast access CCD memory organizations with parallel loops or tracks wherein the total number of data bits which can be stored on a single calculator chip is dependent on the overhead circuitry consisting of a number of refresh amplifiers and various switches required to switch the stored data from a storage track to a read/write location and also on the number of refresh amplifiers as well as control circuitry required for distribution of clock pulses to the respective storage tracks. As the number of switches and refresh amplifiers is increased, so is the total area required for storage bits. As the number of clock switches is increased, the power dissipation for the semiconductor chip is decreased. As the number of refresh amplifiers is increased, the access time and total service time is decreased. A number of different optimum memory organizations are disclosed.

1 Claim, 18 Drawing Figures

| CE | D | WR | RE | MODE |
|----|---|----|----|------|
| 1  | 1 | 0  | X  | READ |
| 1  | 1 | 1  | X  | WRITE |
| 1  | 0 | X  | 0  | STAND BY |
| 1  | 0 | X  | 1  | REFRESH |

\* RMW CAN ALSO BE PERFORMED

CE CHIP ENABLE
WR WRITE READ
RE REFRESH ENABLE
D ADDRESS FOR THAT
  PARTICULAR TRACK

FAST ACCESS CHARGE COUPLED DEVICE MEMORY ORGANIZATIONS FOR A SEMICONDUCTOR CHIP

BACKGROUND OF THE INVENTION

This is a division of application Ser. No. 881,434, filed Feb. 27, 1978, now U.S. Pat. No. 4,156,287; which is a division of application Ser. No. 734,351, filed Oct. 20, 1976, now U.S. Pat. No. 4,112,504.

FIELD OF THE INVENTION

This invention relates to memory organizations formed of charge coupled devices and more particularly to fast access memory organizations for implementation on a single semiconductor chip.

BACKGROUND OF THE INVENTION

Charge coupled devices (CCD's) are fabricated as metal-oxide-silicon (MOS) or metal-insulated-silicon (MIS) integrated circuits wherein charges are stored on the surface of a substrate by the application of voltage pulses to storage gates to form potential wells. Signal charges may be inputted and the resultant charge packets are shifted along various points throughout the substrate of the device by the application of the proper sequence of voltage pulses to modulate the potential wells. A particular application of charge coupled devices is that of forming serial dynamic memory arrays in which the bits are recirculating and are refreshed in closed loops. They can only be accessed at fixed locations in the loop. Such CCD memories have very large storage capacities and also faster access than is provided by other serial type memories such as drums and disks.

Refresh circuitry is required to maintain the magnitude of the charge packets which would otherwise diminish due to transfer inefficiency and to regenerate an empty (or almost empty) charge packet which would otherwise be filled due to thermal dark current. Fabrication of the substrate and the means for shifting the charge packets around the substrate are well described in the prior art as illustrated by the Kosonocky U.S. Pat. Nos. 3,758,794 and 3,760,202. These patents also disclose regeneration circuits, methods and means for operating CCD's in plural phase configurations and clocking and timing means. A number of papers which discuss the application and technology of charge coupled devices include W. S. Boyle and G. E. Smith, "Charge-Coupled Devices—A New Approach to MIS Device Structure" *IEEE Spectrum*, July, 1971; Altman, "The New Concept for Memory and Imaging: Charge Coupling" *Electronics*, June 21, 1971.

In addition to the advantages of shorter access times and higher storage density, CCD's have the advantage over disk and drum type memories of compactness and high reliability because there are no moving parts. As a result, CCD memories have a distinct advantage in cost performance both in multilevel memory hierarchies and when used as individual memories.

The power dissipation and access time of a CCD memory system is dependent upon the memory organization. If access time is used to distinguish between various CCD organizations, two classes can be defined—slow access and fast access. The slow access class is represented by the serial-parallel-serial (SPS) structure and also the single-loop serpentine structure. The fast access class has two types of prior art organizations. The first type is the self-recirculating loop type with an on-chip decoder. These can be formed into a series of loops on a chip with each loop being assigned an address so that the individual loops can be accessed randomly. The bits in the loop are shifted constantly. In this organization, the power dissipation is high but the total area per bit is small. The second type of fast access memories is the line-address-random-access-memory (LARAM). In this organization, the bits in a track are shifted only if that particular track is being refreshed or accessed. All the signal bits are regenerated by a single refresh amplifier for a block of registers. Therefore, when one track is being refreshed no read/write or refreshing operation can be performed in any other track in the same block. This leads to an increase in latency. However, power dissipation is low.

The above described organizations which exist in the prior art are not the only CCD memory organizations possible. Particular organizational designs are characterized by three parameters—the control over the read/write data path, the control over the refresh data path and the control of the clock path. By varying these different parameters, new organizational designs can be achieved which exhibit reduced power dissipation and/or service time.

It is then an object of the present invention to provide a variety of improved fast access charge coupled device memory organizations.

It is another object of the present invention to provide a variety of improved power dissipation charge coupled device memory organizations.

It is another object of the present invention to provide a variety of improved fast access memory organizations for a single CCD semiconductor chip.

It is another object of the present invention to provide a variety of improved power dissipation memory organizations for a single CCD semiconductor chip.

It is still a further object of the present invention to provide fast access CCD memory organizations which have reduced power dissipation and service time.

SUMMARY OF THE INVENTION

In fast access CCD memory organizations with parallel loops or tracks, the total number of data bits which can be stored on a single semiconductor chip is dependent upon the area of the data bit and the overhead circuitry consisting of a number of refresh amplifiers and various switches required to switch the stored data from the storage track to the read/write location of the chip, or to a refresh amplifier and also the control circuitry required for the distribution of clock pulses to the respective storage tracks. Assuming, for a given technology, that the active storage area per bit is the same in all organizations, the total area required per storage bit increases as the number of switches and refresh amplifiers increase. As the number of clock switches is increased, the power dissipation for the chip is decreased; however, the total area required per bit is increased. As the number of refresh amplifiers is increased, the access time and total service time is decreased; however, again, the total area per bit is increased. If a separate common refresh loop or track is provided, two sets of data switches must be provided for each data track both for refresh switching and also for read/write switching which in turn increases the total area required per bit for implementation on a single semiconductor chip.

Features of the present invention reside in organizations having a various number of clock switches, read/- write switches, refresh switches and refresh amplifiers. A particular feature of the present invention resides in a CCD memory organization having a plurality of parallel loops or tracks each of which is provided with a refresh amplifier and where one or more clock switches are provided to selectively supply driving clock pulses to the individual storage tracks. A specific feature of the present invention resides in such an organization where a clock switch is provided for each storage track to selectively supply driving clock pulses.

DESCRIPTION OF THE DRAWINGS

The above and other objects, advantages and features of the present invention will become more readily apparent from a review of the following specification taken in conjunction with the drawings wherein.

DESCRIPTION OF THE INVENTION

Figure 1A:
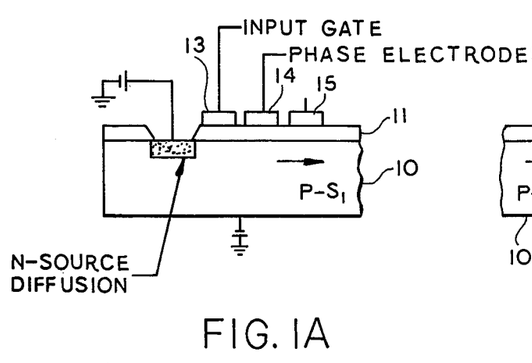
FIGS. 1A-D are cross sectional and schematic representations of CCD memory structures such as may be employed with the present invention.

In order to provide a proper understanding for the present invention, a brief description will be provided of the structure of CCD memories with reference to FIGS. 1A, 1B, 1C and 1D. FIG. 1A illustrates one type of memory structure as well as one of the methods by which signals are inputted to that structure. The memory structure is formed of a silicon substrate 10 having an oxide insulator layer 11 adjacent to which a number of storage gates or electrodes such as 14 and 15 are positioned. Electrodes 14 and 15 serve to form capacitors with substrate 10 which hold charge packets that may be transferred from one electrode to the next as the respective electrodes are energized in phases. Input signals are supplied to input gate 13 to establish a voltage that causes carrier injection from source diffusion area 12 which is an area of substrate 10 that is highly diffused with impurity atoms of opposite polarity.

Figure 1B:
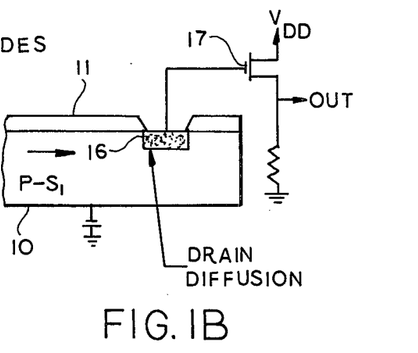

FIG. 1B illustrates one of the methods by which charges are detected and read out of the memory. It will be understood that a number of storage gates are placed adjacent to oxide layer 11 and charge packets are received from the last of such storage gates by drain diffusion area 16 to activate output gate transistor 17.

Figure 1C:
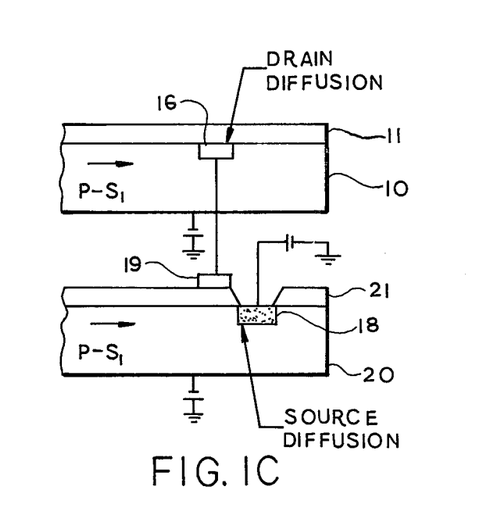

The manner in which the storage signals are detected and transferred from one storage track to the next to form a storage loop is disclosed in FIG. 1C. As illustrated therein, the detection of the reception of the charge packet by drain diffusion area 16 transmits a signal impulse to input gate 19 to initiate carrier injection from source diffusion area 18, it being understood that there are a number of storage gates provided adjacent to the oxide layer 21 and substrate 20 of the second storage track.

Figure 1D:
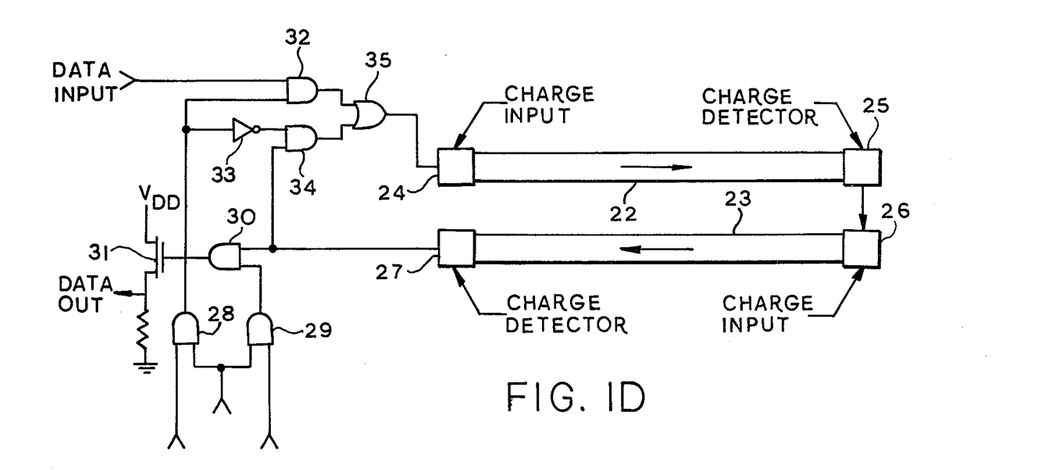

The manner in which a complete storage loop can be formed of structures of FIGS. 1A-C, may be described in relation to FIG. 1D. As illustrated therein, an input signal is received by AND gate 32 and transmitted therefrom, upon the presence of a write signal from AND gate 28, to the input gate 24 of the memory via OR gate 35. The input signals cause charge packets to be transferred along storage track 22 as was described above in relation to FIG. 1A.

When the charge packets reach the end of the storage track 22 they are detected by charge detector 25 and transferred to charge input 26 of storage track 23 as was described above in relation to FIG. 1C. When the charge packets have been transferred the length of storage track 23, they are detected by charge detector 27 and would normally cause signals to be sent back to charge input 24 of track 22 via AND gate 34 and OR gate 35 where AND gate 34 is normally supplied with a positive signal by inverter 33 unless a write signal is received from AND gate 28. Thus, the storage loop is completed. When it is desired to read out of the storage loop, a read signal is transmitted by AND gate 29 to AND gate 30 to transmit the data to transistor gate 31.

Figure 2:
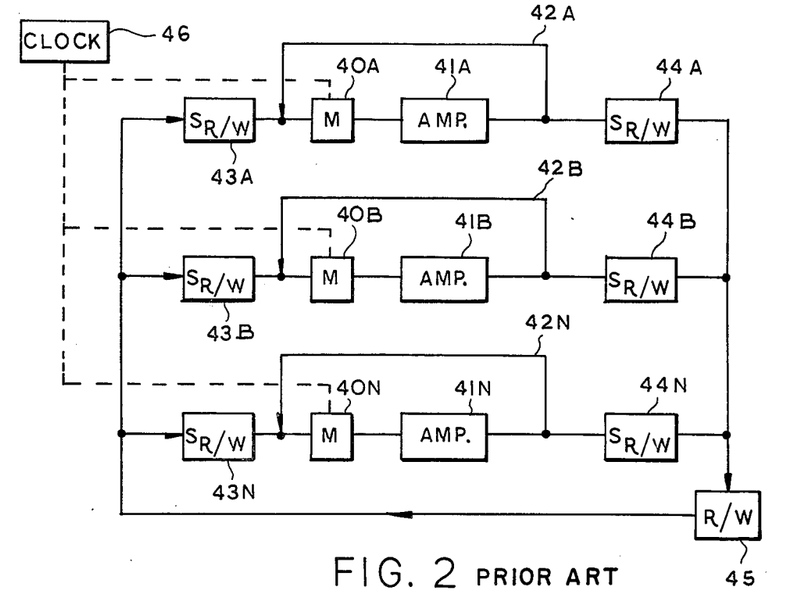
FIGS 2 and 3 are schematic representations of prior art CCD memory organizations.

The memory organizations to be described below are discussed in terms of the control over the read/write data path, the refresh data path and the clock path. The read/write data path is defined as the path through which the signal bits have to pass during read/write operation. Similarly, the refresh data path is the path the bits would go through during refresh. The clock path is self-explanatory. When a read/write operation is performed, the bits in one and only one track have to be shifted. Therefore, all the tracks can share one common read/write data path. Communication between the read/write data path and the tracks are controlled by read/write switches. For the control of refresh data path, three options exist. First, the refresh data path can be the same as the read/write data path. Therefore, the refresh operation is also controlled by the read/write switches, and only one signal regenerator is needed somewhere along the path. Second, all the tracks can share one common refresh data path which is different from the read/write data path. In this case, separate refresh switches are required, one for each track and again, only one refresh amplifier is necessary. Third, each individual track has its own refresh data path. No refresh switch is needed but there should be signal regenerator(s) for each track. For control of the clock path there are, again, three possibilities. First, no switch is present on the clock path. The bits in all the tracks are shifted constantly. Second, only one switch is present and all the bits in the tracks are shifted or stationary simultaneously. Third, there are as many switches as tracks. Here, each track can be idle or shifted, independent of the others. From the combination of the control over the refresh data path and the clock path, nine different designs can be generated as shown from FIGS. 2-10 of which two are prior art designs (FIGS. 2 and 3).

The various systems and organizations of the prior art and also of the present invention employ various conbinations of the mechanisms described above. The two prior art organizations are illustrated in FIGS. 2 and 3. FIG. 2 illustrates a typical recirculating type memory organization as found in the prior art. This organization provides a plurality of shift registers 40A, . . . ,N such as those disclosed in FIG 1D. Each shift register may be considered as a single shift register or two separate shift registers as illustrated in FIG. 1D. Either way, each shift register is provided with a corresponding return electrical path 42A, . . . ,N to complete the storage loop which also includes a corresponding refresh amplifier 41A, . . . ,N. In order to access any one of the storage loops, each loop is provided with an appropriate read switch 44A, ...,N to switch data out of the corresponding storage loop to read/write station 45. In a write mode, data is entered via read/write station 45 and switched to the appropriate storage loop via the corresponding write switch 43A, ...,N. In the organization of FIG. 2, all of the shift registers are constantly driven by clock signals from clock source 46. Since data is constantly being recirculated in each of the storage loops, the power dissipation of this memory organization will be higher than in other reorganizations that will be discussed below.

Figure 3:
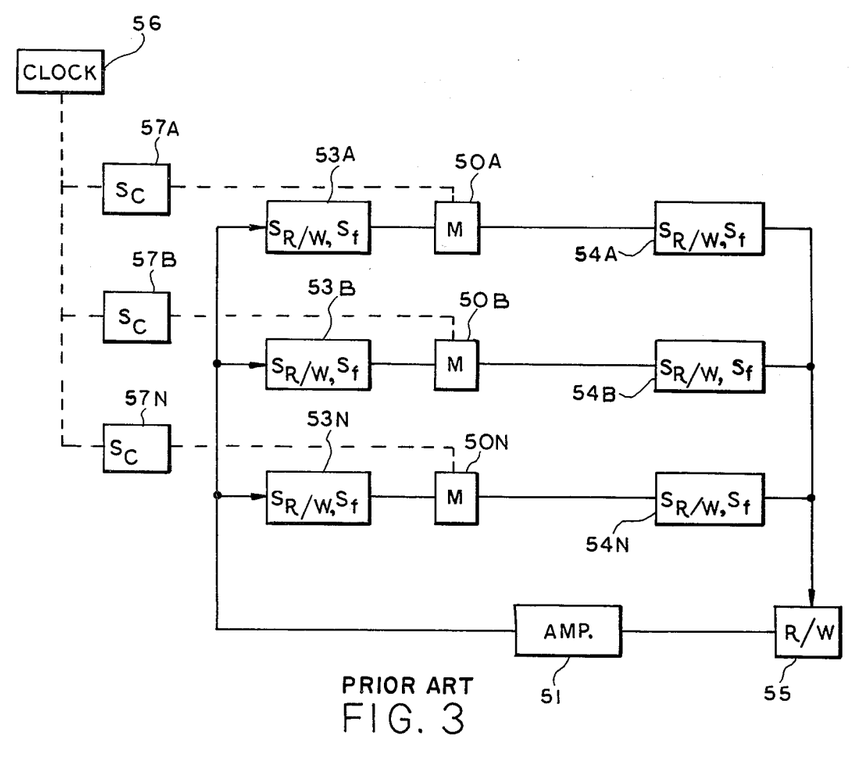

Another prior art CCD memory organization, as illustrated in FIG. 3, is the line-address-random-access-memory (LARAM). In this organization, each of the respective shift registeres 50A, ...,N is not provided with either a return path or an individual refresh amplifier. Clock signals from clock source 56 are supplied to drive the respective shift registers via a series of clock switches 57A, ...,N so that clock pulses need only be supplied to that particular shift register which has been selected for accessing and/or refreshing. When the data is not being shifted in any of the various registers, a constant voltage is supplied to the particular ones in the storage gates to maintain the charge packets therein. Data is transferred out of the respective shift registers via read and refresh switches 54A, ...,N and written back into the respective shift registers from read/write station 55 and refresh amplifier 51 via write and refresh switches 53A, ...,N. A particular advantage of the organization of FIG. 3 is that since data is not constantly being shifted in all of the respective shift registers, power dissipation is reduced. Furthermore, since only one refresh amplifier is provided, the total area which must be allotted to each stored bit is reduced. However, since data in respective shift registers must be constantly refreshed, service time for accessing the respective shift registers is increased as will be more thoroughly described below.

Figure 4:
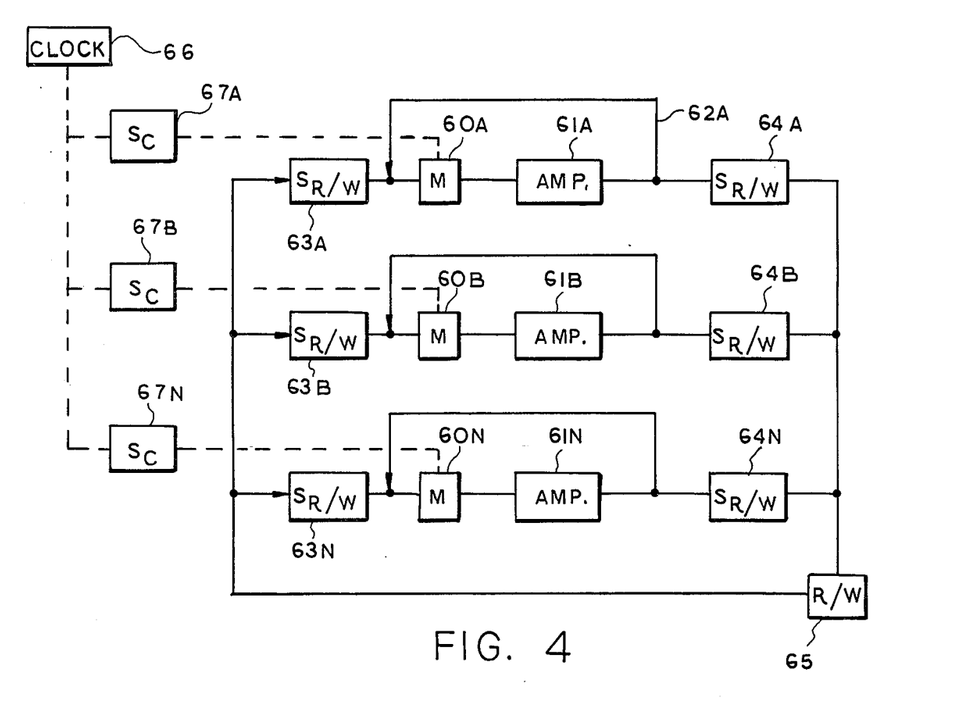
FIGS 4-10 are schematic representations of the memory organizations of the present invention.

Other organizations which have not been disclosed in the prior art will now be described. Such an organization is illustrated in FIG. 4. In that organization, the respective shift register 60A, ...,N are each provided with their own return paths 62A, ...,N and refresh amplifiers 61A, ...,N. In addition, clock signals to drive each of the respective shift registers are selectively supplied by clock switches 67A, ...,N so that only that shift register being accessed need be driven. In this manner, the power dissipation for the memory organization is reduced. Access time is also fairly small since each shift register is provided with its own refresh amplifier. However, the provision of individual refresh amplifiers for each shift register increases the total area per bit required for the organization.

Figure 5:
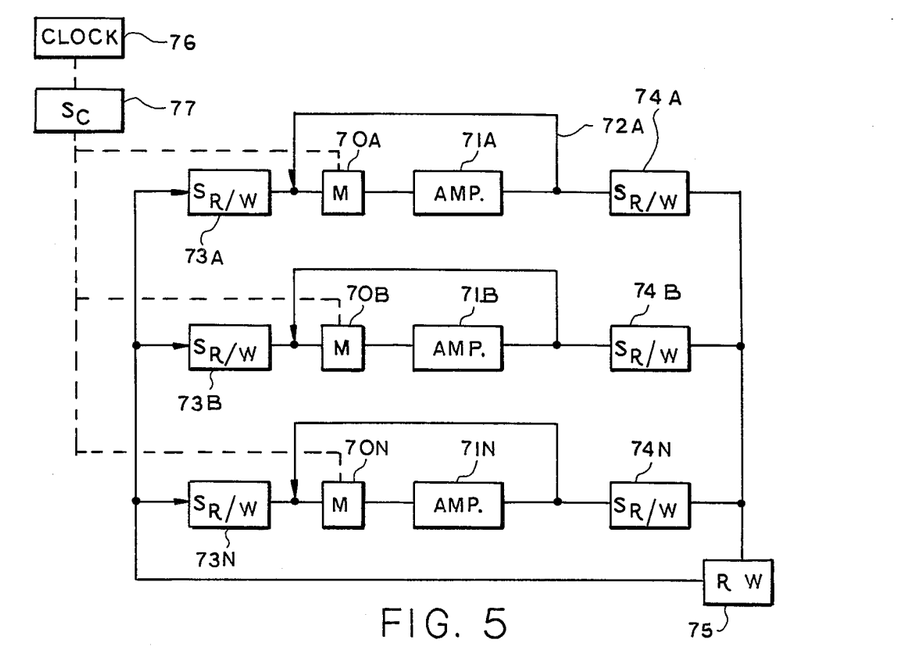

The organization of FIG. 5 is similar to that of FIG. 4 except that only one clock switch 77 is provided so that all of the shift registers are driven during accessing and refreshing but the clock pulses can be inhibited when no shift register requires accessing or refreshing. In this manner, power dissipation is reduced somewhat but not to the extent as in the organization of FIG. 4.

Figure 6:
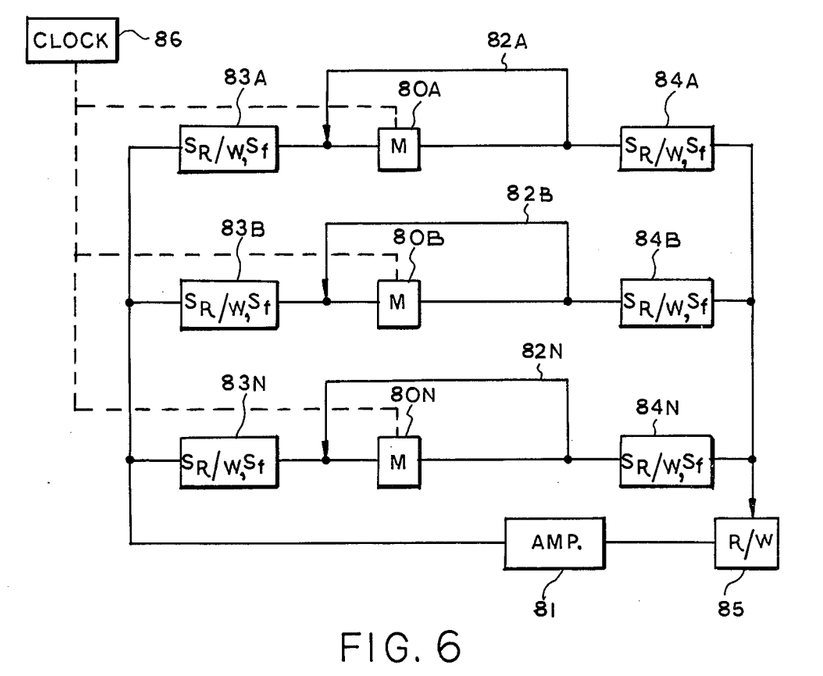

The organization of FIG. 6 differs from prior art devices in that only one refresh amplifier 81 is provided for all of the storage loops. In the organization of FIG. 6, clock pulses from clock source 86 are always supplied to the respective shift registers 80A, ...,80N which are always being driven. As a result, power dissipation is relatively high. Furthermore, service time is relatively large as time must be provided for the refresh operation. However, the total area required per bit in this organization is reduced due to the reduction in the number of clock switches and refresh amplifiers.

Figure 7:
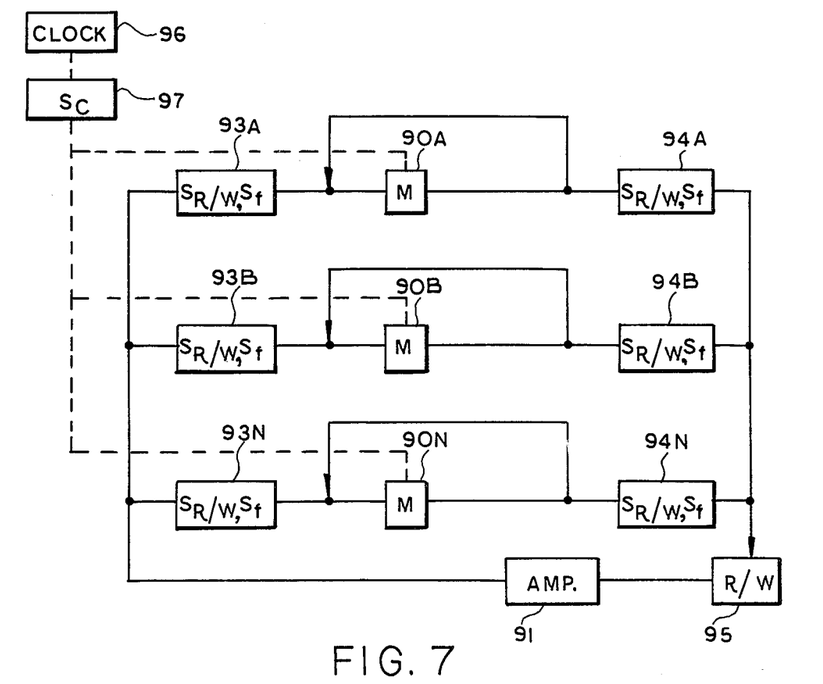

The organization of FIG. 7 is similar to that of FIG. 6 except that one clock switch 97 is provided between the clock source 96 and the respective shift registers 90A, ...,N. In this organization, all of the data bits are shifted whenever access or refresh is required. This in turn provides reduced power dissipation relative to the organization of FIG. 6.

Figure 8:
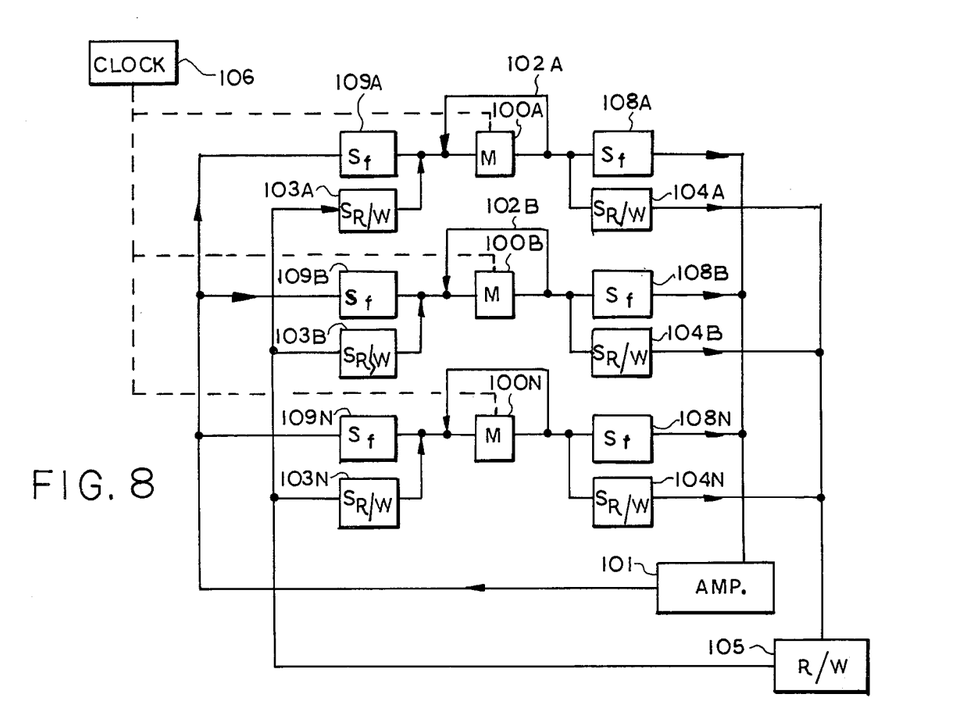

The organization of FIG. 8 differs from the previously described organizations in that separate paths are provided from the respective shift registers 100A, ...,N to a single refresh amplifier 101. This allows for refresh operations to be performed while another storage loop is being accessed and therefore provides a relatively small service time. However, additional refresh switches 108A, ...,N and 109A, ...,N must be provided thereby increasing the total area per bit required in the implementation of this organization. In the organization of FIG. 8, no clock switches are provided and therefore all of the shift registers are constantly being shifted with the resultant high power dissipation.

Figure 9:
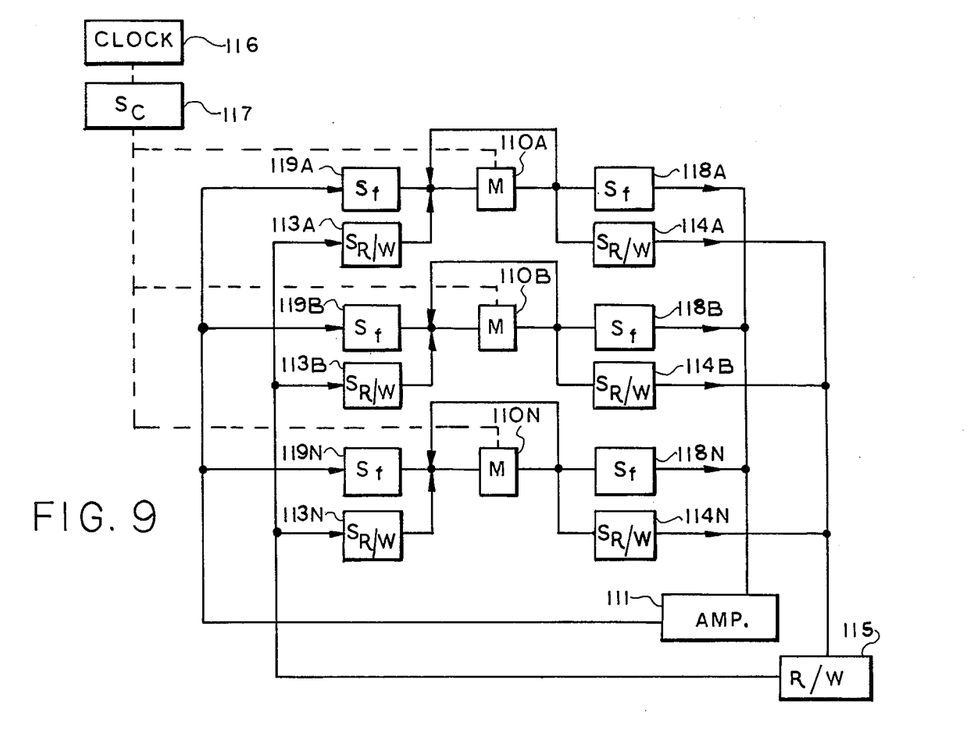

The organization of FIG. 9 is similar to that of FIG. 8 except that a single clock switch is provided between the clock source 116 and the respective shift registers 110A, ...,N so that the respective shift registers are being shifted only when access or refresh operations are required. This tends to reduce the amount of power dissipation of the organization.

Figure 10:
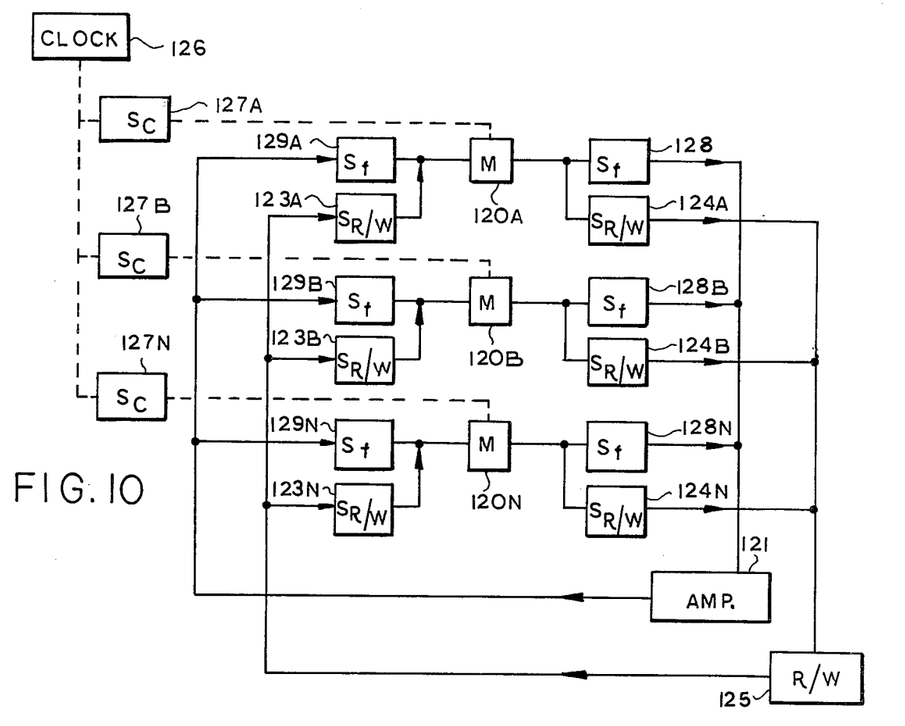

In the organization of FIG. 10, a plurality of clock switches 127A, ...,N are provided one for each of the respective shift registers 120A, ...,N so that only the shift registers being accessed or refreshed need be supplied with clock pulses. This tends to further reduce the power dissipation of the organization.

A number of considerations should be given to the implementation of the various designs described above. For all of the various designs, it should be realized that there are three states existing for each of the storage tracks—the idle state, the refresh state and the access state. When a track is in the access state, the data bits are read out from or written into that particular track. Similarly, for a track in the refresh state, the data bits are regenerated through a refresh amplifier. A track which is neither in the refresh state nor in the access state is in the idle state. As evident from the various designs, the bits in the idle state are either stationary or circulating around a closed loop.

In the organizations with the idle state in which the bits are stationary, logic circuitry should be provided for multi-phase devices such that one phase of the clock must be kept high. For a single phase (and DC) devices, this consideration is not necessary.

Figure 11A:
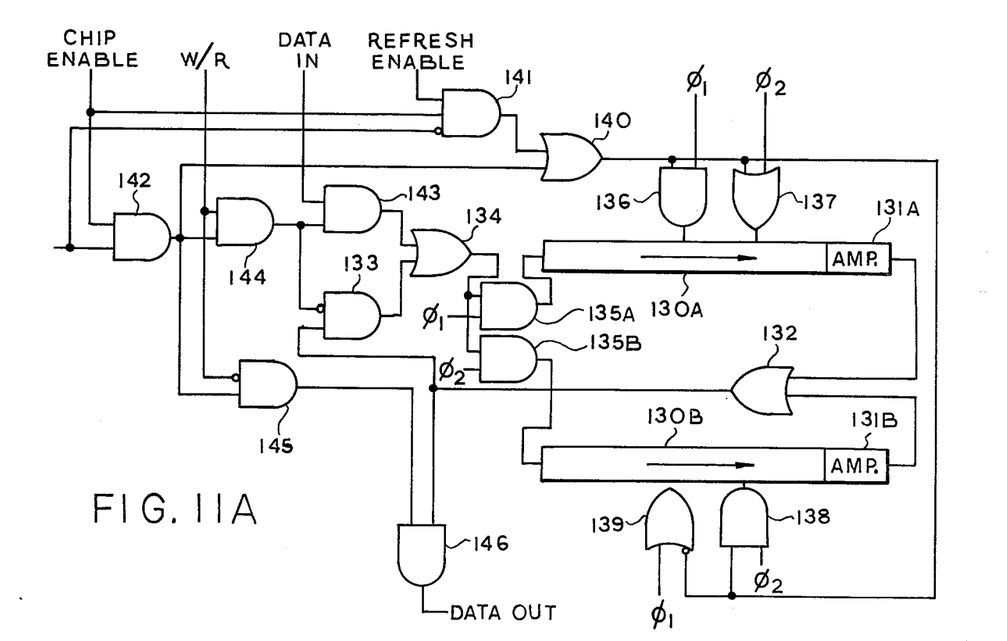
FIGS. 11A and B are schematic diagrams of logic circuitry that may be used with an embodiment of the present invention.
Figure 11B:
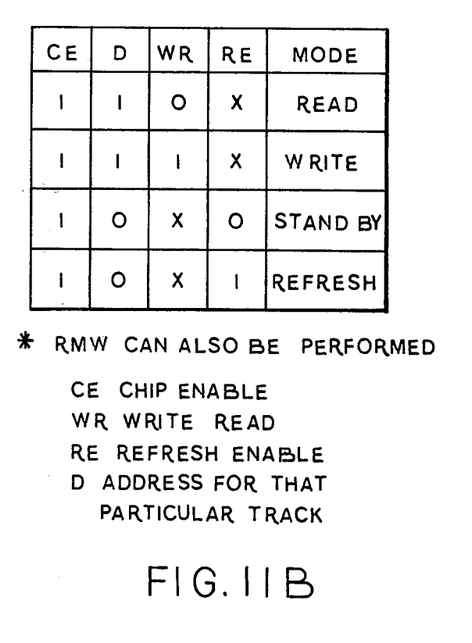

The respective tracks can be multiplexed such that, in a two-phase device, the data rate is twice the clock frequency. To this end, logic circuitry for the organization of FIG. 4 is illustrated in FIG. 11A, together with a truth table in FIG. 11 B. In this logic circuitry, multiplexing of data is used and refresh enable (RE) control is provided so that burst-mode refreshing can be performed. Although a two-phase structure is used, single-phase, three-phase or four-phase structures can easily be implemented in a similar manner.

In FIG. 11A, data is stored in shift registers 130A and 130B which are driven by two-phase clock signals $\phi_1$ and $\phi_2$. The respective registers are provided with refresh amplifiers 131A and 131B. The data is returned from the refresh amplifiers to write gates 135 A and 135B via OR gate 134, AND gate 133 and OR gate 132 when there is no write signal presented to AND gate 144. Data may be entered into either of the shift registers via data in AND gate 143 and OR gate 134 when a write signal is presented to AND gate 144. This action can only occur when a chip enable signal is applied to AND gate 142 along with another signal from the address decoder for the respective storage track locations (which decoder is not shown). When a refresh enable signal is presented to AND gate 141 and there is no signal received from the decoder or a chip enable signal presented to AND gate 142, then the respective shift registers 130A and 130B are driven during both phases $\phi_1$ and $\phi_2$. Data is read out of the respective registers when no write signal is presented to AND gate 145.

FIG. 11B is a table illustrating which enable and other signals are required for the various modes of operation. As indicated, the read modify write (RMW) operation can also be performed.

The advantages of the memory organization described above which are not in the prior art will now be discussed in comparison with those organizations which are in the prior art, namely the recirculating type of FIG. 2 and the line-address-random-access-memory (LARAM) of FIG. 3. Certain assumptions must be made in order to allow such comparisons. For example, the same level of technology is assumed to be used in all organizations. The active area per bit is assumed to be the same in each organization. The same frequency of operation is assumed in each organization. The refresh time is the same. The read/write operation always starts with bit number 1 of each memory location. During a read/write operation, the whole storage track for that location is read out and written in. During a refresh operation, the whole track is refreshed. Where applicable, the refresh operation will be performed only as often as is necessary.

Figure 12:
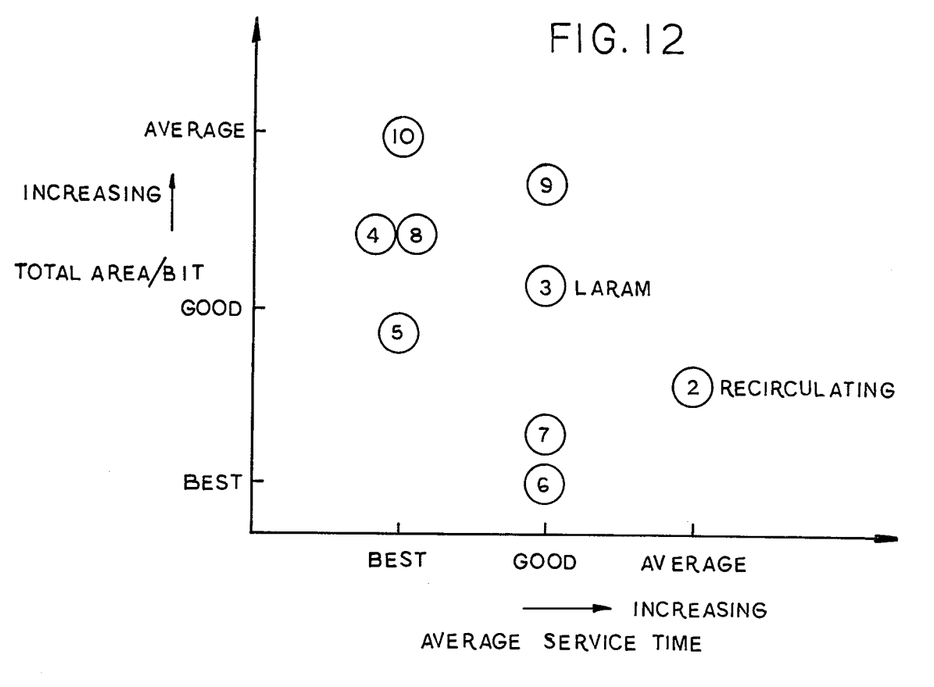
FIGS. 12-14 are graphical representations illustrating the advantages of the present invention.

With these assumptions, the average service time versus the total area required per bit for each organizational design is illustrated in FIG. 12. The respective numbers in this graph refer to the Figure number of the organization as has been discussed above. The average service time is defined as the access time and data transfer time. In regard to FIG. 12, it is assumed that there are an equal number of bits per track in all of the organizational designs so that the average transfer time is the same for all designs. Therefore, the individual service times represented by FIG. 12 vary as does the access time for each of the storage tracks. In both FIGS. 12 and 13, the total area per bit is a function of the number of clock switches, refresh switches and refresh amplifiers and also the areas for metal interconnections.

In FIG. 12, it is evident that certain of the organizational designs have a definite advantage over the prior art designs. For example, organizational designs of FIGS 4 and 5 have a shorter average service time than the line-address-random-access-memory organization of FIG. 3. The recirculating type CCD structure of FIG. 2 has poor performance in regard to power dissipation and also service time. In regard to service time, it should be noted that if there were external circuitry provided which would re-align the data bits, so that the read/write operation could start at any bit position, the average service time of the recirculating type memory design of FIG. 2 would be greatly reduced although there would be an increased peripheral cost.

Figure 13:
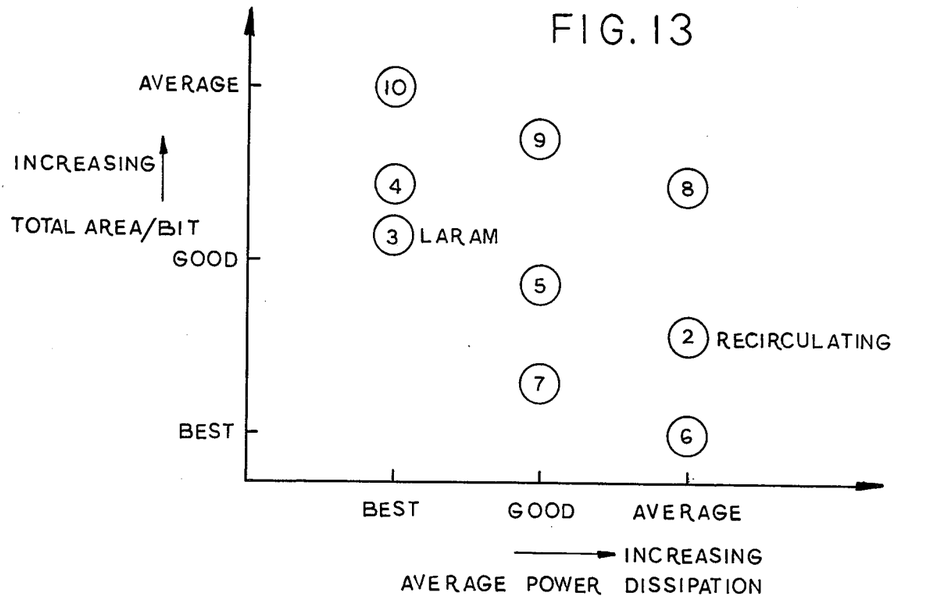

The average power dissipation versus total area required per bit for each organization is illustrated in FIG. 13. In FIG. 13, it is apparent that organizational designs of FIGS. 2, 6 and 8 have the highest power dissipation since no clock switches are provided in those designs and charge transfer occurs throughout the operation of those designs. Organizational designs of FIGS. 5,7 and 9 which have only one clock switch have a lower power dissipation since the charge transfer operation is performed in all of the storage tracks but only during the read/write and refresh operations. The lowest average power dissipation comes from the organizational designs of FIGS. 4, 3 and 10 where only one storage track is being shifted during either a read/write operation or a refresh operation.

Figure 14:
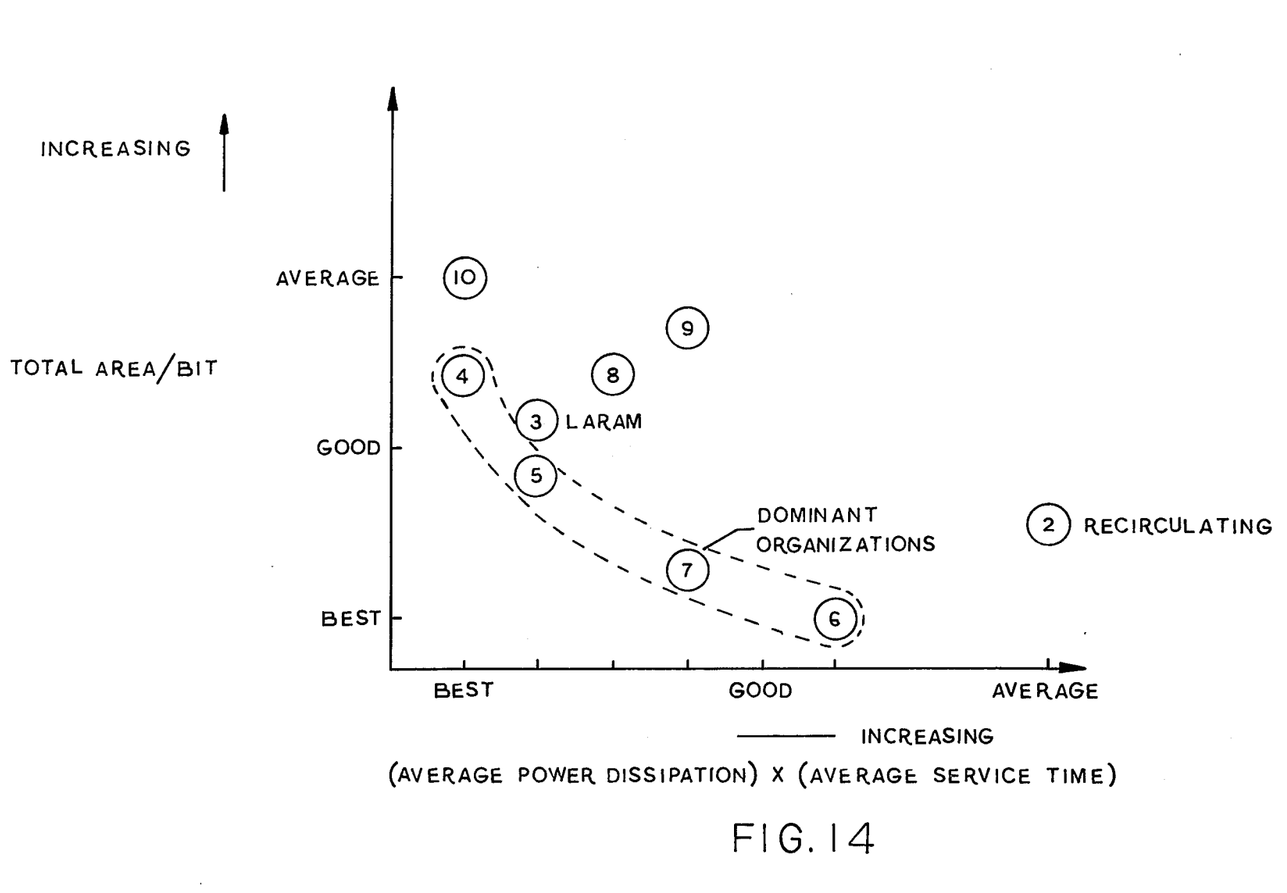

FIG. 14 represents the product of the average power dissipation and average service time versus the total area required per bit for each organization. In FIG. 14, a set of dominant organizations which are enclosed by the dotted circle, can be defined which have better cost and performance characteristics than other organizational designs including those designs in the prior art.

While but a few embodiments of the present invention have been set forth above, it will be apparent to one skilled in the art that modifications and variations may be made therein without departing from the spirit and the scope of the invention as claimed.

What is claimed is:

1. A charge coupled device memory organization comprising:
   a plurality of storage loops each containing a return path;
   a read/write station;
   a plurality of pairs of read and write switches, each pair for each storage loop to selectively couple that respective storage loop to said read/write station for reading and writing operations;
   a refresh amplifier coupled between said read/write station and said plurality of write switches; and
   clock means simultaneously coupled to all of said storage loops to supply clocking signals to shift all of said storage loops at the same time.

* * * * *